United States Patent
Ulmer et al.

(10) Patent No.: US 9,627,437 B1
(45) Date of Patent: Apr. 18, 2017

(54) PATTERNED PHOSPHORS IN THROUGH HOLE VIA (THV) GLASS

(71) Applicant: Sharp Laboratories of America, Inc., Camas, WA (US)

(72) Inventors: Kurt Michael Ulmer, Vancouver, WA (US); Paul John Schuele, Washougal, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 15/199,923

(22) Filed: Jun. 30, 2016

(51) Int. Cl.
| H01L 33/00 | (2010.01) |
| H01L 27/15 | (2006.01) |
| H01L 33/50 | (2010.01) |
| H01L 33/62 | (2010.01) |
| H01L 33/60 | (2010.01) |

(52) U.S. Cl.
CPC .......... *H01L 27/156* (2013.01); *H01L 33/502* (2013.01); *H01L 33/60* (2013.01); *H01L 33/62* (2013.01); *H01L 2933/0041* (2013.01); *H01L 2933/0058* (2013.01); *H01L 2933/0066* (2013.01)

(58) Field of Classification Search
CPC ..... H01L 27/156; H01L 33/502; H01L 33/60; H01L 33/62; H01L 2933/0041; H01L 2933/0058; H01L 2933/0066
USPC .......................................................... 257/89
See application file for complete search history.

(56) References Cited

U.S. PATENT DOCUMENTS

| 5,355,577 A | 10/1994 | Cohn |
| 5,545,291 A | 8/1996 | Smith et al. |
| 5,696,389 A | 12/1997 | Ishikawa et al. |
| 5,904,545 A | 5/1999 | Smith et al. |
| 6,527,964 B1 | 3/2003 | Smith et al. |
| 6,566,744 B2 | 5/2003 | Gengel |
| 6,623,579 B1 | 9/2003 | Smith et al. |
| 6,771,019 B1 | 8/2004 | Wu et al. |
| 6,821,805 B1 | 11/2004 | Nakamura et al. |
| 6,927,382 B2 | 8/2005 | King et al. |
| 7,528,422 B2 | 5/2009 | Murphy |
| 7,589,355 B2 | 9/2009 | Tomoda et al. |
| 7,687,277 B2 | 3/2010 | Sharma et al. |
| 7,727,788 B2 | 6/2010 | Han et al. |
| 7,727,804 B2 | 6/2010 | Smith |
| 7,731,556 B2* | 6/2010 | Okanan ............. H01J 9/20 257/40 |
| 7,874,474 B2 | 1/2011 | Kim et al. |

(Continued)

FOREIGN PATENT DOCUMENTS

| JP | 2006-278511 | 10/2006 |
| JP | 11-186590 | 7/2007 |
| JP | 2007-294566 | 11/2008 |

OTHER PUBLICATIONS

Morris et al "Self-assembly for microscale and nanoscale packaging: steps toward self-packaging", IEEE Trans. Adv. Packag., 2005, 28, 600-611.

(Continued)

*Primary Examiner* — Tu-Tu Ho
(74) *Attorney, Agent, or Firm* — Hamilton, DeSanctis & Cha (57) ABSTRACT

Embodiments are related generally to display fabrication, and more particularly to a fluidic assembly process for the placement of light emitting diodes on a transparent display substrate.

22 Claims, 6 Drawing Sheets

(56) References Cited

U.S. PATENT DOCUMENTS

| | | | |
|---|---|---|---|
| 7,928,655 | B2 | 4/2011 | Lin et al. |
| 7,931,063 | B2 | 4/2011 | Craig et al. |
| 8,076,178 | B2 | 12/2011 | Krishnamoorthy et al. |
| 8,318,595 | B2 | 11/2012 | Morris et al. |
| 8,426,227 | B1 | 4/2013 | Bibl et al. |
| 8,516,683 | B2 | 8/2013 | Credelle et al. |
| 8,552,436 | B2 | 10/2013 | Bibl et al. |
| 8,629,465 | B2 | 1/2014 | Yu et al. |
| 8,648,328 | B2 | 2/2014 | Crowder et al. |
| 8,685,774 | B2 | 4/2014 | Crowder et al. |
| 9,477,114 | B2 * | 10/2016 | Chen ................ G02F 1/133602 |
| 2003/0057444 | A1 | 3/2003 | Niki et al. |
| 2007/0031992 | A1 | 2/2007 | Schatz |
| 2007/0120463 | A1 | 5/2007 | Hayashi et al. |
| 2007/0224713 | A1 | 9/2007 | Han et al. |
| 2008/0036038 | A1 | 2/2008 | Hersee et al. |
| 2010/0163895 | A1 | 7/2010 | Horie |
| 2010/0276664 | A1 | 11/2010 | Hersee |
| 2011/0031516 | A1 | 2/2011 | Basin et al. |
| 2013/0161584 | A1 | 6/2013 | Crowder et al. |
| 2013/0161643 | A1 | 6/2013 | Crowder et al. |
| 2014/0008696 | A1 | 1/2014 | Kim et al. |
| 2014/0077158 | A1 | 3/2014 | Crowder et al. |
| 2014/0355931 | A1 | 12/2014 | Tummala et al. |
| 2015/0060402 | A1 | 3/2015 | Burkett et al. |
| 2015/0140721 | A1 | 5/2015 | Moslehi et al. |
| 2015/0155445 | A1 | 6/2015 | Zhan et al. |
| 2015/0166396 | A1 | 6/2015 | Marjanovic et al. |
| 2015/0214430 | A1 | 7/2015 | Zhan et al. |

OTHER PUBLICATIONS

Boncheva "Millimeter-scale self-assembly and its applications", Pure Appl. Chem., 75, No. 5, pp. 621-630, 2003.

Mastrangeli et al "Self-assembly from milli- to nanoscales: methods and applications" J. Micromech. Microeng., 2009,19, 063001, (37 PP).

Yeh "Fluidic self-assembly for the integration of GaAs light-emitting diodes on Si substrates", IEEE Photonics Technol. Lett., 1994, 6, 706-708.

Tien "Microfabrication through electrostatic self-assembly", Langmuir, 1997, 13, 5349-5355.

Snyder et al "Fluidic self-assembly of semiconductor devices: a promising new method of mass-producing flexible circuitry", Jpn. J. Appl. Phys., 2002,41,4366-4369.

Chung,Programmable reconfigurable self-assembly: parallel heterogeneous integration of chip-scale components on planar and nonplanar surfaces, J. Microelectromech. Syst., 2006.

Stauth "Self-assembled single-crystal silicon circuits on plastic", Proc. Natl. Acad. Sci. U. S. A., 2006, 103, 13922-13927.

Saeedi et al "Self-assembled single-digit micro-display on plastic", Proc. of SPIE, 2008, 6885, 688509.

Park "Orientation-specific self-assembly at air-water interface using magnetic field", Transducers'11, Beijing, China, Jun. 5-9, 2011, 866-869.

Tkachenko "Evaluation of directed self-assembly process for LED assembly on flexible substrates", Electronic Components & Technology Conference (ECTC), 2013 IEEE 63rd.

Nakagawa "Controlled deposition of silicon nanowires on chemically patterned substrate by capillary force using a blade-coating method", J. Phys. Chem. C, 2008,112, 5390-5396.

Arase, "Interfacial-energy-controlled deposition technique of microstructures using blade-coating", J. Phys. Chem. B. 2009, 113, 15278-15283.

Nakagawa "Interfacial-force-controlled placing technique of microstructures of sub- to one hundred micrometer size using blade coating", Jpn. J. Appl. Phys., 2011, 50, 01BJ09.

Arase, "Fluidic self-assembly of microstructures using a blade-coating technique" Jpn J. Appl. Phys., 2012, 51, 036501.

Nordquist et al., "An Electro-Fluidic Assembly Technique for Integration of III-V Devices onto Silicon" IEEE International Symposium on Compound Semiconductors, Proc. 2000.

Khare et al "Via Hole Formation in Semi-Insulating InP Using Wet Photoelectrochemical Etching" Indium Phosphide and Related Materials, 1993. Conference proceedings.

Brusberg et al, "Thin Glass Based Packaging Technologies for Optoelectronic Modules" Electronic Components and Technology Conference, 2009.

Kim et al Large Scale Self-assembly of crystalline semiconductor microsomponents onto plastic substrates via microfluidic traps 4th IEEE Conf. on Automation (2008).

Xiao et al "Fluidic assisted thin-film device heterogeneous integration: surface tension as driving force and magnetic as guiding force" Science Direct (2015).

Yeh et al, "New fabrication technique for the integration of large area optoelectronic display panels" OSA/CLEO (1994).

Varna et al "Fluidic self-assembly of silicon microstructures" University of CA Berkley (1995).

Talghader Integration of LEDs and VCSELs using fluidic self-assembly (SPIE vol. 3286, p. 86) (Downloaded Sep. 23, 2016).

Zheng et al, "Self-assembly process to integrate and connect semiconductor dies on surfaces with single-angular orientation and contact pad registration" Adv. Mater. (2006,18).

Park et al "A First Implementation of an Automated Reel-to-Reel Fluidic Self-Assembly Machine" Adv. Mater. vol. 26, No. 34, Sep. 2014 Available online Jun. 2014.

Park et al "Printed Assemblies of Inorganic Light-Emitting Diodes for for Deformable and Semitransparent Displays" Aug. 2009 www.Sciencemag.org.

Jacobs et al "Fabrication of a Cylindrical Display by Patterned Assembly" Science, vol. 296, Apr. 2002.

Chung et al "Guided and Fluidic Self-Assembly of Microstructures Using Railed Microfluidic channels" Pub. online Jun. 15, 2008.

* cited by examiner

Fig. 4A  GLASS WITH THV

Fig. 4B  DEPOSIT REFLECTOR

Fig. 4C  DEPOSIT PHOSPHOR

Fig. 4D  PRINT BLUE FILTER

Fig. 4E  ETCH REFLECTOR

Fig. 4F  FULL COLOR DISPLAY

PATTERNED PHOSPHORS IN THROUGH HOLE VIA (THV) GLASS

FIELD OF THE INVENTION

Embodiments are related generally to display fabrication, and more particularly to a fluidic assembly process for the placement of light emitting diodes on a transparent display substrate.

BACKGROUND

Various forms of fluidic assembly may be used to assemble micro light emitting diode (μLED) devices o form a display. In some cases, μLED disks are suspended in a solvent and distributed across a large substrate for fabrication of a display. The μLED disks are aligned in a regular array in order to allow subsequent processing and integration steps such as metallization. In a simple example of the fluidic assembly of a μLED display, one type and size of μLED is used to form the display pixels. Typically, the μLED for such an application would be a single color emission LED, such as blue. There are advantages in this type of display including ease of assembly and cost of production. Color conversion is required in order to make a red-green-blue (RGB) display from a monochrome μLED light source.

Hence, there exists a need in the art for advanced systems and methods for providing color conversion in an emissive display using a monochrome light source.

SUMMARY

Embodiments are related generally to display fabrication, and more particularly to a fluidic assembly process for the placement of light emitting diodes on a transparent display substrate.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phrases do not necessarily refer to the same embodiment. Many other embodiments of the invention will become more fully apparent from the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIGS. 1A, 1C, and 1D are partial cross-sectional views.

DETAILED DESCRIPTION OF SOME EMBODIMENTS

Embodiments are related generally to display fabrication, and more particularly to a fluidic assembly process for the placement of light emitting diodes on a transparent display substrate.

Various embodiments provide direct emission display panels. The panels include: a substrate with a top surface and a bottom surface, wherein the substrate includes a plurality of through-hole vias (THVs) aligned in a plurality of parallel rows, where each THV exhibits a first diameter; a color phosphor material filling a first subset of the plurality of THVs; a film overlying the top surface of the substrate, where the film includes a plurality of wells with each well of the plurality of wells aligned in a row and exposes a corresponding one of the plurality of THVs, and each well exhibits a second diameter that is greater than the first diameter; and a plurality of light emitting diode (LED) disks, where a respective one of the plurality of LED disks is situated in each well of the plurality of wells, and each LED disk of the plurality of LED disks exhibits a disk diameter that is both greater than the first diameter and less than the second diameter.

In some instances of the aforementioned embodiments, each LED disk of the plurality of LED disks is configured to emit a common first color. In some such instances, the panel is organized into pixel sections with each pixel section including (n) THVs, where n is an integer. (n−1) unique color phosphor materials fill corresponding THVs in each pixel section, and each of the (n−1) color phosphor materials is respectively configured to pass a different color. The panel further includes a first color filter formed on a surface of the substrate and configured to block the first color. The first color filter overlies the (n−1) THVs in each pixel section. In some cases, the (n−1) color phosphor materials are each configured to pass a color different than the first color.

In various instances of the aforementioned embodiments, the substrate further includes a plurality of bottom electrically conductive traces, with each bottom conductive trace associated with a corresponding row of THVs, and connected to a bottom contact of each LED disk in the row. In some such instances the film has a first thickness and the LED disks have about the same first thickness. In such instances, the panel further includes: a plurality of top electrically conductive traces, with each top electrically conductive trace associated with a corresponding column of THVs, and connected to a top contact of each LED disk in the column.

In one or more instances of the aforementioned embodiments, the THVs have tapered sidewalls with a diameter increasing in size from the substrate top surface to the substrate bottom surface. In some cases, sidewalls of the THVs are coated with a reflective material.

Other embodiments of the present inventions provide methods for forming a fluidic assembly direct-emission display panel. The methods include: providing a substrate with a top surface and a bottom surface; forming through-hole vias (THVs) in the substrate aligned in a plurality of parallel rows, each THV having a first diameter; forming a film overlying the substrate top surface; forming a plurality of wells in the film, each well having a second diameter greater than the first diameter, and aligned in a row exposing a corresponding THV; flowing an ink comprising a solvent and a plurality of light emitting diode (LED) disks overlying the film, where each LED disk has a disk diameter greater than the first diameter and less than the second diameter; capturing the LED disks in the wells; and filling a first plurality of the THVs with a color phosphor material.

In some instances of the aforementioned embodiments, flowing the ink includes flowing the ink comprising LED disks capable of emitting a common first color. In some such instances, providing the substrate includes providing the substrate organized into pixel sections, where each pixel section includes a plurality of (n) THVs, and filling with the color phosphor material includes filling corresponding THVs in each pixel section with (n−1) unique color phosphors respectively capable of passing (n−1) unique colors. In such instances, the methods may further include: forming a first color filter, capable of blocking the first color, overlying the (n−1) THVs in each pixel section, on the substrate bottom surface. In some cases, filling corresponding THVs with (n−1) unique color phosphors includes filling with color phosphor materials each passing a unique color other than the first color.

In other instances of the aforementioned embodiments, forming the THVs includes forming THVs having tapered sidewalls with a diameter increasing in size from the substrate top surface to the substrate bottom surface. In some such instances, the methods further include: subsequent to forming the THVs, coating the THVs sidewalls with a reflective material.

Yet other embodiments of the present inventions provide direct-emission display panels that include: a display backplane with a top surface; a plurality of light emitting diode (LED) disks overlying the backplane top surface arranged in pixel sections each comprising a plurality of LED disks, where each LED disk is capable of emitting a common first color; a first transparent substrate overlying the backplane top surface with a through-hole via (THV) overlying a first LED disk in each pixel section; a color phosphor material formed in the THVs in the first transparent substrate, capable of passing a second color, different than the first color; and a first color filter, capable of blocking the first color, overlying the THVs in the first transparent substrate.

In some instances of the aforementioned embodiments where each pixel section comprises (n) LED disks, the panel further includes: (n−2) transparent substrates stacked overlying the first transparent substrate, each of the (n−2) transparent substrates with THVs overlying a unique LED disk in each pixel section; and (n−2) color phosphor materials respectively formed in the THVs of the (n−2) transparent substrates, each of the (n−2) color phosphor materials capable of passing a unique color different than the first color and the second color.

In one or more instances of the aforementioned embodiments, the THVs in the first transparent substrate have tapered sidewalls, with a diameter narrowing from a top surface of the first transparent substrate to a bottom surface of the first transparent substrate overlying the backplane top surface. In some such instances, the panel further includes a reflective material lining the THVs in the substrate.

Yet further embodiments of the present inventions provide methods for forming a direct-emission display panel. The methods include: providing a display backplane with a top surface; forming a plurality of light emitting diode (LED) disks overlying the backplane top surface arranged in pixel sections each comprising a plurality of LED disks, where each LED disk is capable of emitting a common first color; forming a first transparent substrate; forming through-hole vias (THVs) in the first transparent substrate, to overlie a first LED disk in each pixel section; forming a color phosphor material in the THVs in the first transparent substrate, capable of passing a second color, different than the first color; forming a first color filter, capable of blocking the first color, overlying the THVs in the first transparent substrate; and stacking the first transparent substrate overlying the display backplane top surface.

Figure 1A:
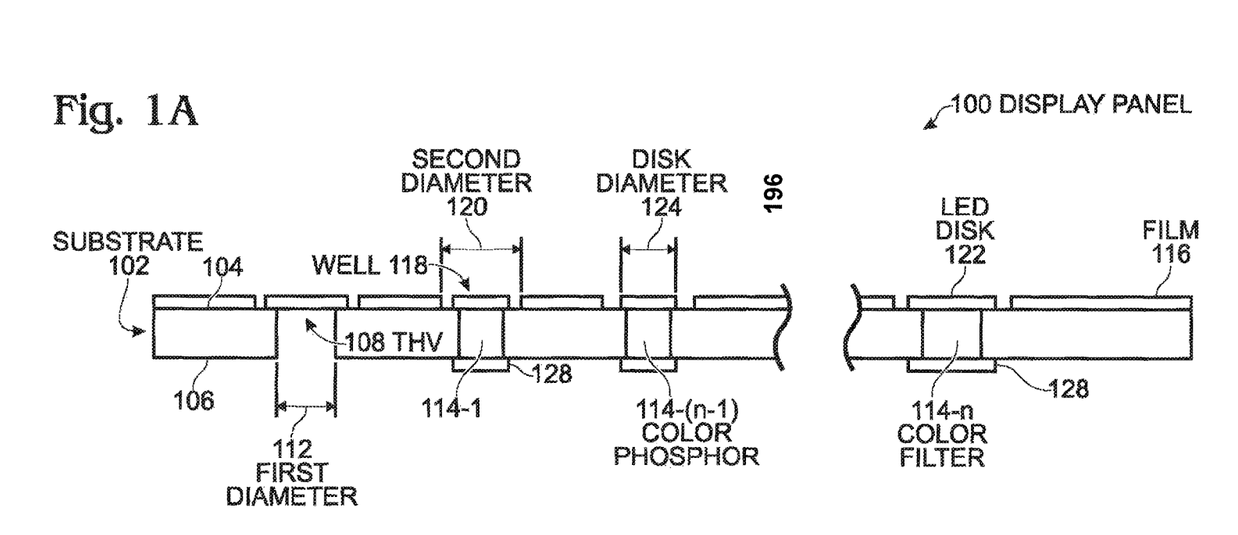
Figure 1B:
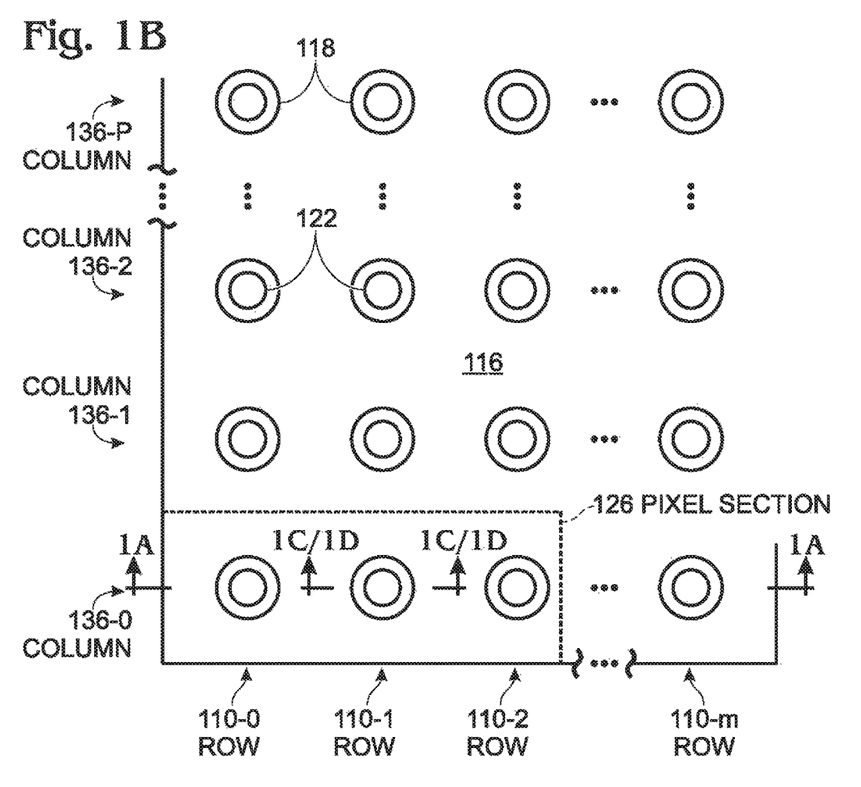
FIG. 1B is a plan view of a direct-emission display panel in accordance with some embodiments of the present inventions.
Figure 1C:
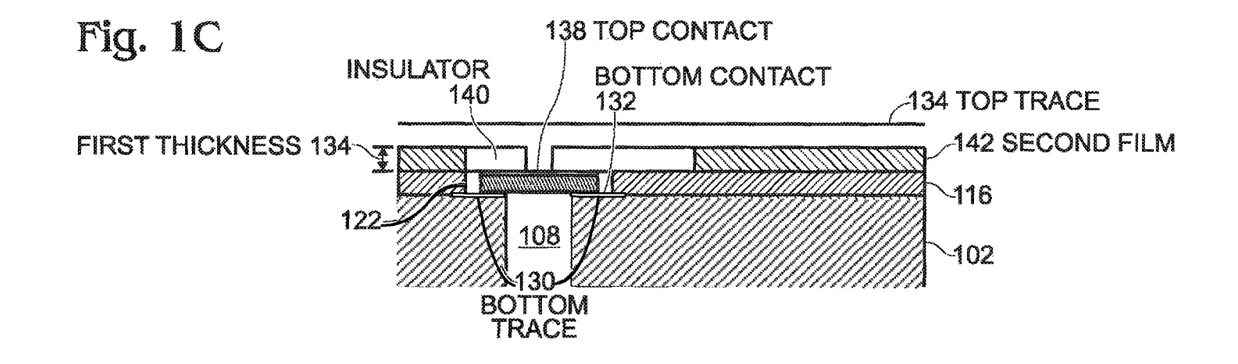
Figure 1D:
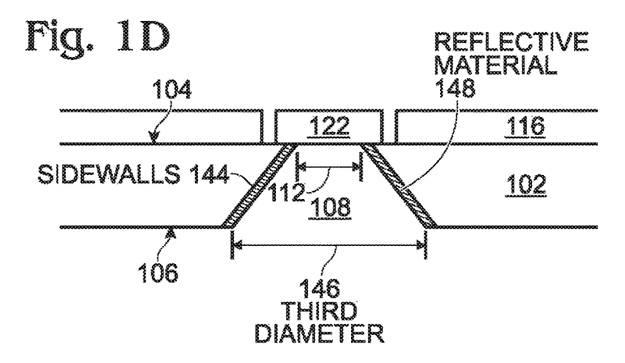

FIGS. 1A, 1C, and 1D are partial cross-sectional views, and FIG. 1B is a plan view of a direct-emission display panel. The panel 100 comprises a substrate 102 with a top surface 104 and a bottom surface 106. A number of through-hole vias (THVs) 108 are aligned in a plurality of parallel rows 110-0 through 110-*m*, where m is an integer greater than one (1). Each THV 108 has a first diameter 112. A color phosphor material (114-1 through 114-*n*) fills some of the THVs 108, while other THVs are not filled by a color phosphor material. A film 116 overlies a portion of top surface 104 of substrate 102 leaving wells 118 open. As one example, film 116 may be a photo patternable laminate photoresist or a liquid photoresist. In some embodiments, substrate 102 may be, but is not limited to, glass with a thickness of greater 100 microns (typically 500 microns), and film 116 may be 5 microns thick.

Each well 118 is aligned in a row (110-0 through 110-*m*) and exposes a corresponding THV 108. Each well 118 has a second diameter 120 which is greater than first diameter 112. A light emitting diode (LED) disk 122 is situated in each well 118. Each LED disk 122 has a disk diameter 124 that is greater than first diameter 112, but less than second diameter 120. In some cases, each LED disk 122 is capable of emitting a common first color (e.g., blue).

As shown in FIG. 1B, in some embodiments display panel 100 is organized into pixel sections (e.g., pixel section 126). Each pixel section includes (n) THVs where n an integer. In the depicted embodiment, n is three (3). It should be noted that n may be any integer value. (n−1) (i.e., where n is three, n−1 is two) unique color phosphor materials, 114-1 and 114-(*n*−1), respectively, fill corresponding THVs in each pixel section. As such, each pixel section includes phosphor materials configured to pass (n−1) different colors. The (n−1) color phosphor materials each pass a color that is different from the first color emitted by LED disks 122. Optionally as shown, a first color filter 128, capable of blocking the first color, overlies the (n−1) THVs in each pixel section, formed on the substrate bottom surface. That is, the first color filters 128 may cover the THVs filled with a color phosphor to reduce the leakage of the first color emitted by the LED disks 122.

As shown in FIG. 1C, substrate 102 further includes a plurality of bottom traces 130 with at least one of the plurality of bottom traces being included in each of wells 118. Bottom traces 130 are formed of electrically conductive material and are configured to be an electrical contact to LED disks 122. Each of the plurality of bottom traces 130 is associated with a corresponding row of THVs (e.g., row 110-0), and connected to a bottom contact 132 of each LED disk 122 in the row. Film 116 has a first thickness 134 and LED disks 122 may be about the same thickness as that of Film 116. In some embodiments, the difference between the thickness of LED disks 122 and first thickness 134 is less than half (50%) of the overall thickness of LED disks 122.

A plurality top traces 196 are associated with each column of THVs (i.e., a column includes a line of individual THVs associated with respective rows). Each of the plurality of top traces 196 is formed of an electrically conductive material and are configured to be an electrical contact to LED disks 122. FIG. 1B shows top conductive trace 196 that is associated with column 136-0. Columns 136-0 through 136-$p$ are shown in FIG. 1B, where p is an integer not limited to any particular value. Top trace 196 is connected to a top contact 138 of each of the LED disks 122 in the respective column. Also shown is an optional insulator or dielectric material 140 that may overly LED disk 122. In some embodiments, a second film 142 is formed over film 116. Second film 142 has slots parallel to the rows. The width of the slots is greater than second diameter 120 to help place the LED disks during fluidic assembly. Second film 142 may be formed of, but is not limited to, a photo patternable laminate photoresist or a liquid photoresist. Of note, for clarity top trace 196, insulator 140, and second film 142 are not shown in FIG. 1B.

In some embodiments, as shown in FIG. 1D, THVs 108 have tapered sidewalls 144 with a diameter increasing in size from the substrate top surface 104 to the substrate bottom surface 106. That is, the THV diameter changes from the first diameter 112 to a third diameter 146. Optionally, the sidewalls of THVs 108 are coated with a reflective material 148.

The display panel shown in FIGS. 1A through 1D may be assembled by fluidic means. In this back emitting single substrate version, the substrate 102 may be a glass backplane. Prior to LED disk (μLED) assembly, the substrate may metalized and the metal is patterned for LED disk bottom disk electrical connection and optionally the THVs are coated as shown in FIG. 1D. For the purpose of this example it is assumed that the LED disks are oriented in such a way that the display is bottom emitting, meaning the bulk of the light coming from the LED disks is directed through the glass substrate.

Figure 2:
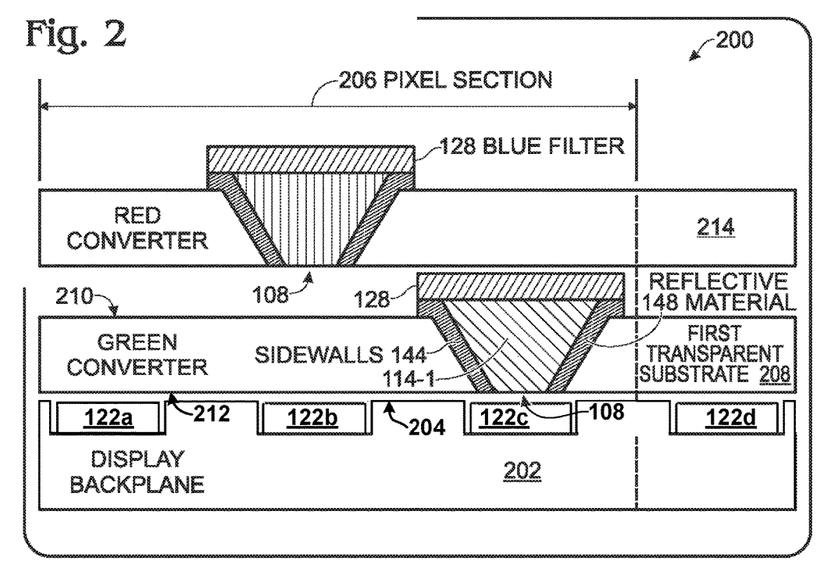
FIG. 2 is a partial cross-sectional view of a direct-emission display panel in accordance with various embodiments of the present inventions.

Turning to FIG. 2, a partial cross-sectional view of a variation of the direct-emission display panel 200 is shown in accordance with various embodiments. Panel 200 comprises a display backplane 202 with a top surface 204. A plurality of LED disks 122 overlie top surface 204 of backplane 202, and are arranged in pixel sections 206 each comprising a plurality of LED disks 122. As shown, pixel section 206 includes 3 LED disks (n=3) (i.e., LED disk 122$a$, LED disk 122$b$, LED disk 122$c$). Each LED disk 122 is capable of emitting a common first color. A first transparent substrate 208 overlies top surface 204 of backplane 202, and includes a THV 108 overlying LED disk 122$c$ in pixel section 206. It should be noted that while only one pixel section 206 is shown, a panel may include a number of pixel sections each including LED disks 122 arranged in rows and columns. A color phosphor material 114-1 is formed in THV 108 of first transparent substrate 208. Color phosphor material 114-1 is designed to pass a second color that is different from the first color. For example, color phosphor material 114-1 may pass green light. A first color filter 128 that is designed to block the first color overlies the THV 108 in first transparent substrate 208. As depicted in FIG. 2, THVs 108 may be formed with tapered sidewalls 144, with a diameter narrowing from the top surface 210 of the first transparent substrate 208 to the bottom surface 212 of the first transparent substrate overlying the backplane top surface 204. Alternatively, THVs 108 may be formed with straight sidewalls 144. In either case, the sidewalls of THVs 108 may be coated with optically reflective material 148.

In some embodiments, each pixel section 206 includes (n) LED disks, where n is an integer. If n is greater than or equal to 3, (n−2) transparent substrates are stacked overlying the first transparent substrate 208. Each of the (n−2) transparent substrates have THVs 108 overlying a unique LED disk 122 in each pixel section 206. Using the example where n=3, (n−2) is therefore equal to 1 and as such one transparent substrate 214 overlies the first transparent substrate 208. Likewise, (n−2) color phosphor materials are respectively formed in THVs 108 of the (n−2) transparent substrates. Each of the (n−2) color phosphor materials is designed to pass a unique color different than both the first color and the second color. Again, since n=3 is this example, two (2) color phosphor materials are used, one of which is represented by color phosphor material 114-(n−1).

In panel 200 depicted in FIG. 2, separate transparent substrates 208 and 214 are used for color conversion of light emitted from respective LED disks 122 on top surface 104 of backplane 202. In some embodiments, transparent substrates 208, 214 are formed of glass. In various embodiments, the combination of backplane 202 and LED disks 122 are assembled using fluidic assembly processes. LED disks 122 are positioned on display backplane 202 with a spacing that matches THVs 108 in the overlying color conversion layers 208 and 214. In the same way as described in FIGS. 3A through 3C below, phosphor ink may be applied to the THVs to pattern the phosphor color conversion layer. This can be done on a single transparent substrate supporting one or more colors of color phosphor materials 114, or on multiple transparent substrates each supporting a single color of color phosphor materials 114. Transparent substrates 208, 214 thus form color conversion substrates, and are aligned with LED disks 122 on display backplane 202 and bonded/laminated in place.

Additional metallization, light blocking, and filter layers can be included in applicable designs to enhance image quality in various ways. Assuming the use of blue emission LED disks, the conversion scheme of FIG. 2 includes blue filter layer 128, that absorb any blue light that is not converted by the respective color phosphor materials 114 to yield pure red or green colors. Reflective coating layers 148 may be applied to sidewalls 144 of THVs 108. Because the emission from color phosphor materials is in all directions, the use of such reflective coating layers 148 helps prevent red or green photons from entering the glass layer where they could travel to adjacent pixels creating a blurred image.

Figure 3A:
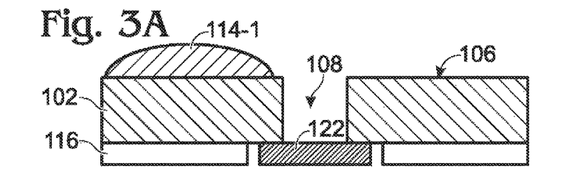
FIGS. 3A through 3C are cross-sectional views depicting an example process for the application of phosphor materials in accordance with one or more embodiments of the present inventions.
Figure 3B:
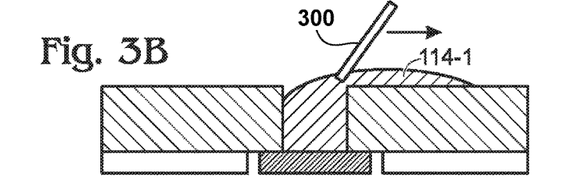
Figure 3C:
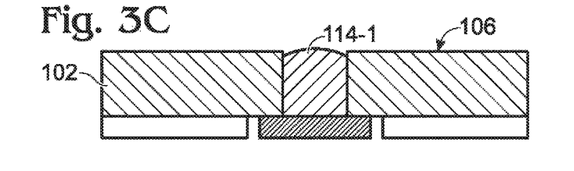

FIGS. 3A through 3C are cross-sectional views depicting an example process for the application of color phosphor materials. In FIG. 3A, a phosphor ink including a selected color phosphor material (e.g., color phosphor material 114-1) is dispensed onto a surface 106 of substrate 102. A doctor bade 300 is used to move the dispensed color phosphor material 114-1 into THV 108 over LED disk 122 as shown in FIG. 3B. As shown in FIG. 3C, excess phosphor ink is wiped from surface 106 of substrate 102.

Figure 4A:
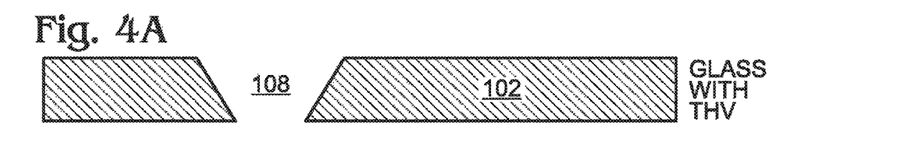
FIGS. 4A through 4F depict an example process flow for the fabrication of the display panel of FIG. 2 in accordance with particular embodiments of the present inventions.
Figure 4B:
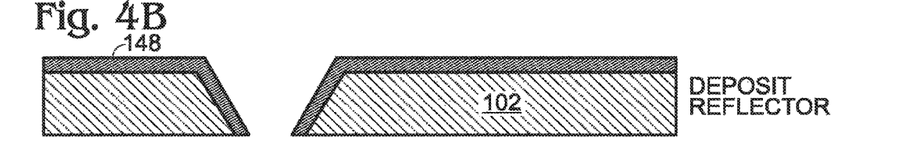
Figure 4C:
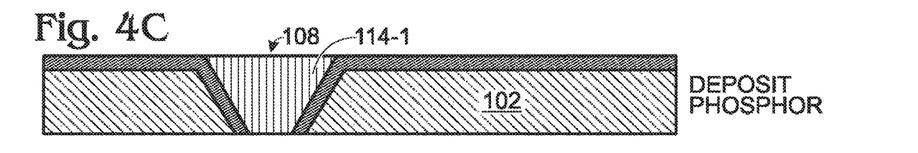
Figure 4D:
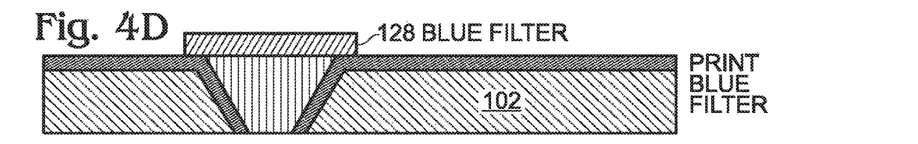
Figure 4E:
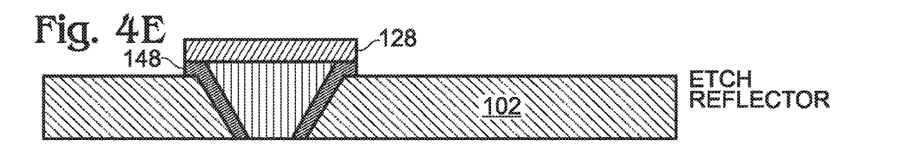

FIGS. 4A through 4F depict an example process for the fabrication of the display panel of FIG. 2. In FIG. 4A, a glass substrate 102 is formed with THVs 108 of size and spacing to allow light to transmit from underlying LED disks in a desired pattern of rows and columns. THVs 108 may be tapered (as shown) to improve ink filling, reflector step coverage, and light extraction. In FIG. 4B, a reflective layer 148 is deposited by sputtering, evaporation, or spray pyrolysis. Reflective layer may be formed of Ti/Al, Ti/gold, or some other metal layer. In FIG. 4C. a phosphor ink including color phosphor material 114-1 (e.g., red) is dispensed onto the substrate 102 to fill THVs 108. In FIG. 4D, a blue filter layer 128 is printed that absorbs light with wavelength shorter than the red phosphor emission. Blue filter 128 exhibits a larger in diameter than color phosphor material 114-1 formed in THV 108 so that all light passing through color phosphor material 114-1 passes through blue filter layer 128. In some embodiments, the filter cut-off wavelength of blue filter layer 128 is selected to be close to the red emission peak wavelength (in this example) in order to improve the color gamut at the expense of efficiency. In FIG. 4E, the reflector layer 148 not covered by of blue filter layer 128 (i.e., blue filter layer 128 is used as an etch mask layer) is etched so that the substrate 102 surrounding the red color converter is transparent. The processes from FIGS. 4A to 4E yield a color converter of a given color defined by the selected color phosphor material 114-1. In this example, color phosphor material 114-1 is red yielding a red color converter. The same processes are repeated to form another layer using a different color phosphor material to yield a green color converter.

Figure 4F:
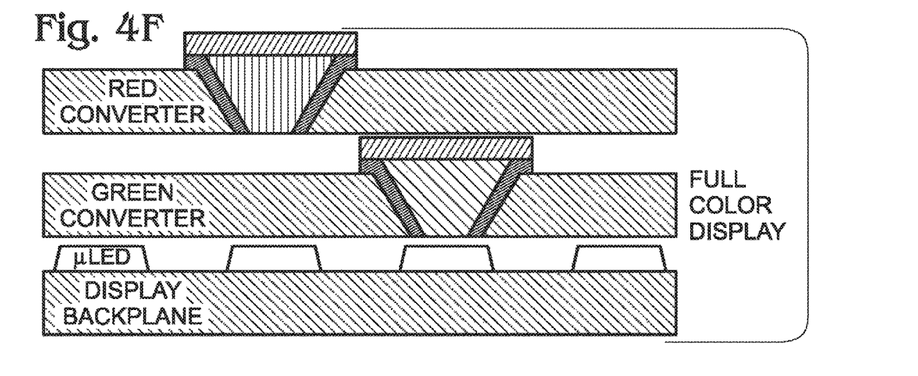

Finally, in FIG. 4F, a green color converter is bonded to a display backplane including an array of LED disks (indicated as μLEDs) such that green color phosphor material deposited in THVs is aligned with a first subset of the LED disks. A red color converter is bonded to the green color converter such that red color phosphor material deposited in THVs is aligned with a second subset of the LED disks. A third subset of the LED disks are not covered by either the red color phosphor material or the green color phosphor material. In some embodiments, the LED disks are designed to have an emission wavelength that is below the absorption threshold of the color conversion phosphor. In some cases, the LED disks may be high brightness blue diode devices made from gallium nitride (GaN) that emit at about 455 nanometers (nm). Other shorter wavelength ultraviolet (UV) LEDs can also be used.

Figure 5:
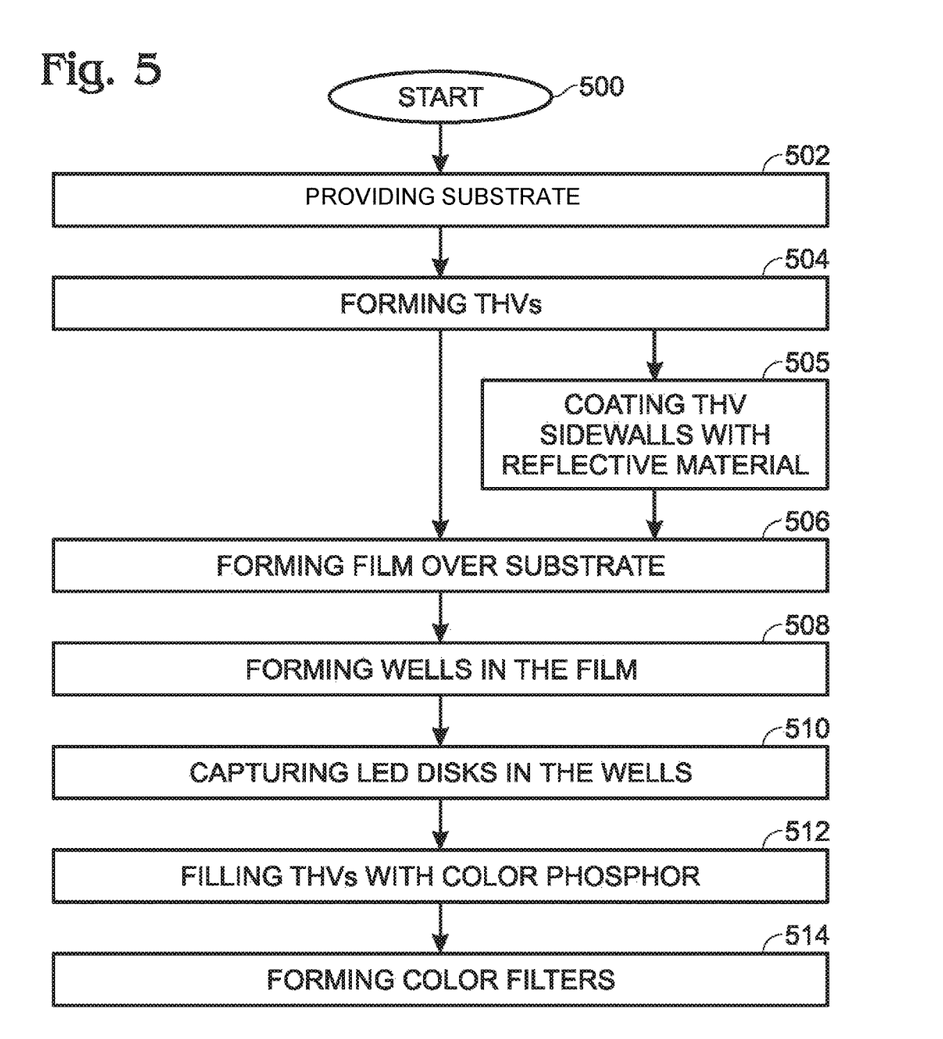
FIG. 5 is a flowchart illustrating a method for forming a fluidic assembly direct-emission display panel in accordance with various embodiments of the present inventions.

FIG. 5 is a flowchart 500 illustrating a method for forming a fluidic assembly direct-emission display panel. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally, the depicted steps and can be better appreciated in context of the explanation of FIGS. 1 through 4F. The method starts at Step 500.

Step 502 provides a substrate with a top surface and a bottom surface. Typically, the substrate is transparent. Step 504 forms THVs in the substrate aligned in a plurality of parallel rows. Each THV has a first diameter, as defined with respect to the substrate top surface. Step 506 forms a film overlying the substrate top surface. Step 508 forms a plurality of wells in the film. Each well has a second diameter greater than the first diameter, and is aligned in a row exposing a corresponding THV. Step 508 flows an ink comprising a solvent and a plurality of light emitting diode (LED) disks overlying the film. Typically, the LED disks all emit, when enabled, a common first color. Each LED disk has a disk diameter greater than the first diameter and less than the second diameter. In Step 510 the LED disks are captured in the wells. Step 512 fills a first plurality of the THVs with a color phosphor material.

In one aspect, Step 502 provides a substrate organized into pixel sections, where each pixel section includes a plurality of (n) THVs. If n is greater than or equal to 2, Step 512 fills corresponding THVs in each pixel section with (n−1) unique color phosphors respectively capable of passing (n−1) unique colors. Then, Step 514 forms a first color filter, capable of blocking the first color, overlying the (n−1) THVs in each pixel section, on the substrate bottom surface. That is, Step 512 fills corresponding THVs with (n−1) unique color phosphors, each passing a unique color other than the first color. Alternatively but not shown, Steps 512 and 514 may be performed before Step 506.

In another aspect, forming the THVs in Step 504 includes forming THVs having tapered sidewalls with a diameter increasing in size from the substrate top surface to the substrate bottom surface. Then, subsequent to forming the THVs, Step 505 coats the THVs sidewalls with a reflective material.

Figure 6:
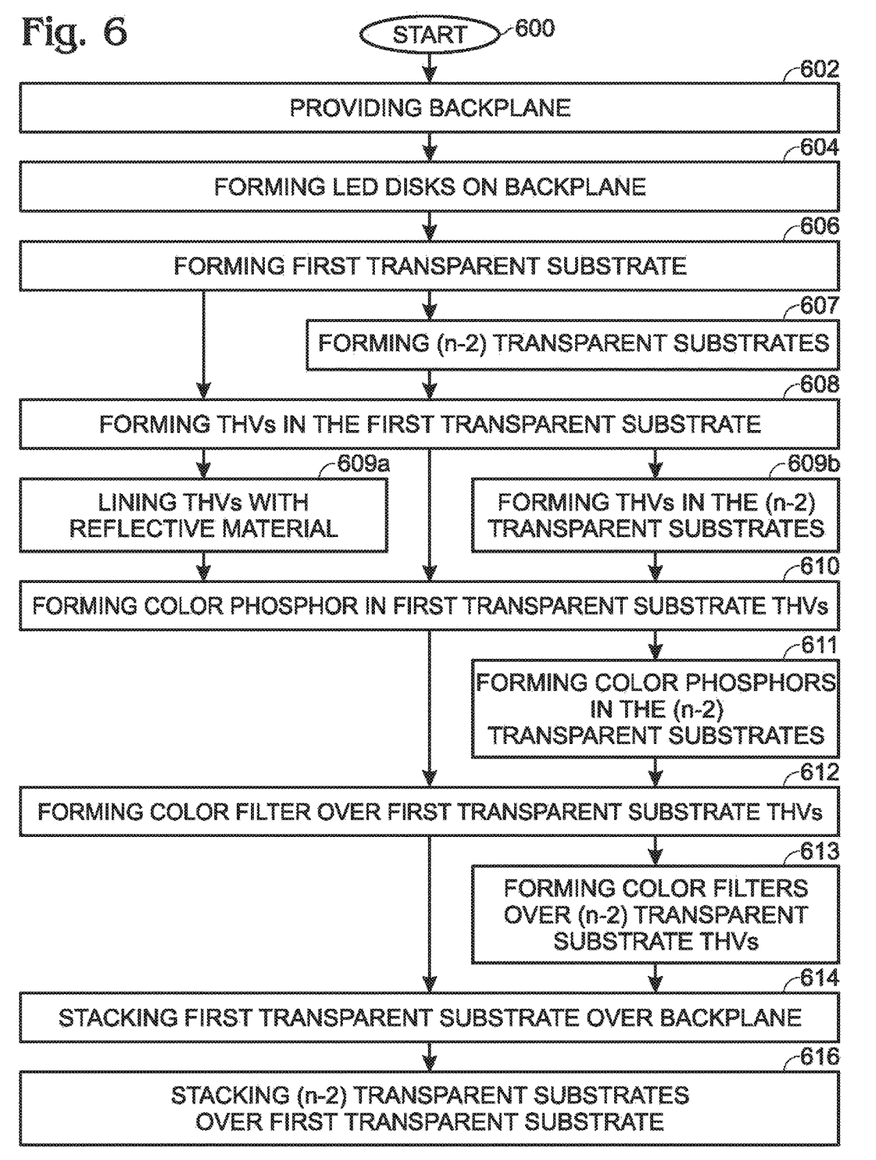
FIG. 6 is a flowchart illustrating another method for forming a direct-emission display panel in accordance with some embodiments of the present inventions.

FIG. 6 is a flowchart illustrating another method for forming a direct-emission display panel. The method starts at Step 600. Step 602 provides a display backplane with a top surface. Step 604 forms a plurality of LED disks overlying the backplane top surface arranged in pixel sections each comprising a plurality of LED disks. Each LED disk is capable of emitting a common first color (e.g., blue). Step 606 forms a first transparent substrate. Step 608 forms THVs in the first transparent substrate to overlie a first LED disk in each pixel section. Step 610 forms a color phosphor material in the THVs in the first transparent substrate, capable of passing a second color, different than the first color. Step 612 forms a first color filter, capable of blocking the first color, overlying the THVs in the first transparent substrate. Step 614 stacks the first transparent substrate overlying the display backplane top surface.

In one aspect, forming the THVs in the first transparent substrate in Step 608 includes forming tapered sidewalls in the THVs, with diameters narrowing from a top surface of the substrate to a bottom surface of the substrate overlying the backplane. Step 609a lines the THVs in the substrate with a reflective material.

In one aspect, Step 604 arranges each pixel section to comprise (n) LED disks. Typically, n is greater than or equal to 2. If n is greater than or equal to 3, then Step 607 forms (n−2) transparent substrates. Step 609b forms THVs in the (n−2) transparent substrates respectively to overlie a unique LED disk in each pixel section. Step 611 forms (n−2) unique color phosphor materials, respectively, in the THVs of the (n−2) transparent substrates, respectively capable of passing (n−2) unique colors different than the first color and the second color. Step 613 forms a first color filter overlying the THVs in the (n−2) transparent substrates. Step 616 stacks the (n−2) transparent substrates overlying the first transparent substrate. Note: alternatively but not shown, Steps 602 and 604 may be performed after Step 612 (or Step 613).

One of ordinary skill in the art will recognize various advantages achievable through use of different embodiments of the inventions. As just some of many advantages, lower display costs are possible. Based upon the disclosure provided herein, one of ordinary skill in the art will recognize a variety of other advantages achievable through use of one or more embodiments of the present inventions.

In conclusion, the invention provides novel systems, devices, methods and arrangements for displays. While detailed descriptions of one or more embodiments of the invention have been given above, various alternatives, modifications, and equivalents will be apparent to those skilled in the art without varying from the spirit of the invention. For example, while some embodiments are discussed in relation to displays, it is noted that the embodiments find applicability to devices other than displays. As another example, while embodiments are discussed as having particular materials and processing steps the scope of the inventions are not limited to these specific examples. Therefore, the above description should not be taken as limiting the scope of the invention, which is defined by the appended claims.

What is claimed is:

1. A direct-emission display panel comprising:
   a substrate with a top surface and a bottom surface, wherein the substrate includes a plurality of through-hole vias (THVs) aligned in a plurality of parallel rows, wherein each THV exhibits a first diameter;
   a color phosphor material filling a first subset of the plurality of THVs;
   a film overlying the top surface of the substrate, wherein the film includes a plurality of wells, wherein each well of the plurality of wells is aligned in a row and exposes a corresponding one of the plurality of THVs, and wherein each well exhibits a second diameter that is greater than the first diameter; and
   a plurality of light emitting diode (LED) disks, wherein a respective one of the plurality of LED disks is situated in each well of the plurality of wells, wherein each LED disk of the plurality of LED disks exhibits a disk diameter that is both greater than the first diameter and less than the second diameter.

2. The panel of claim 1, wherein each LED disk of the plurality of LED disks is configured to emit a common first color.

3. The panel of claim 2, wherein the panel is organized into pixel sections with each pixel section including (n) THVs; wherein n is an integer; wherein (n−1) unique color phosphor materials fill corresponding THVs in each pixel section; wherein each of the (n−1) color phosphor materials is respectively configured to pass a different color; and wherein the panel further comprises:
   a first color filter formed on a surface of the substrate and configured to block the first color, wherein the first color filter overlies the (n−1) THVs in each pixel section.

4. The panel of claim 3, wherein the (n−1) color phosphor materials are each configured to pass a color different than the first color.

5. The panel of claim 1, wherein the substrate further comprises a plurality of bottom electrically conductive traces, with each bottom conductive trace associated with a corresponding row of THVs, and connected to a bottom contact of each LED disk in the row.

6. The panel of claim 5, wherein the film has a first thickness and the LED disks have about the same first thickness; the panel further comprising:
   a plurality of top electrically conductive traces, with each top electrically conductive trace associated with a corresponding column of THVs, and connected to a top contact of each LED disk in the column.

7. The panel of claim 1, wherein the THVs have tapered sidewalls with a diameter increasing in size from the substrate top surface to the substrate bottom surface.

8. The panel of claim 7, wherein the tapered sidewalls of the THVs are coated with a reflective material.

9. A method for forming a fluidic assembly direct-emission display panel, the method comprising:
   providing a substrate with a top surface and a bottom surface;
   forming through-hole vias (THVs) in the substrate aligned in a plurality of parallel rows, each THV having a first diameter;
   forming a film overlying the substrate top surface;
   forming a plurality of wells in the film, each well having a second diameter greater than the first diameter, and aligned in a row exposing a corresponding THV;
   flowing an ink comprising a solvent and a plurality of light emitting diode (LED) disks overlying the film, where each LED disk has a disk diameter greater than the first diameter and less than the second diameter;
   capturing the LED disks in the wells; and,
   filling a first plurality of the THVs with a color phosphor material.

10. The method of claim 9 wherein flowing the ink includes flowing the ink comprising LED disks capable of emitting a common first color.

11. The method of claim 10 wherein providing the substrate includes providing the substrate organized into pixel sections, where each pixel section includes a plurality of (n) THVs;
    wherein filling with the color phosphor material includes filling corresponding THVs in each pixel section with (n−1) unique color phosphors respectively capable of passing (n−1) unique colors; and,
    the method further comprising:
    forming a first color filter, capable of blocking the first color, overlying the (n−1) THVs in each pixel section, on the substrate bottom surface.

12. The method of claim 11 wherein filling corresponding THVs with (n−1) unique color phosphors includes filling with color phosphor materials each passing a unique color other than the first color.

13. The method of claim 9 wherein forming the THVs includes forming THVs having tapered sidewalls with a diameter increasing in size from the substrate top surface to the substrate bottom surface.

14. The method of claim 13 further comprising:
    subsequent to forming the THVs, coating the THVs sidewalls with a reflective material.

15. A direct-emission display panel comprising:
    a display backplane with a top surface;
    a plurality of light emitting diode (LED) disks overlying the backplane top surface arranged in pixel sections each comprising a plurality of LED disks, where each LED disk is capable of emitting a common first color;
    a first transparent substrate overlying the backplane top surface with a through-hole via (THV) overlying a first LED disk in each pixel section;
    a color phosphor material formed in the THVs in the first transparent substrate, capable of passing a second color, different than the first color; and,
    a first color filter, capable of blocking the first color, overlying the THVs in the first transparent substrate.

16. The panel of claim 15 wherein each pixel section comprises (n) LED disks;
    the panel further comprising:
    (n−2) transparent substrates stacked overlying the first transparent substrate, each of the (n−2) transparent substrates with THVs overlying a unique LED disk in each pixel section; and,
    (n−2) color phosphor materials respectively formed in the THVs of the (n−2) transparent substrates, each of the (n−2) color phosphor materials capable of passing a unique color different than the first color and the second color.

17. The panel of claim 15 wherein the THVs in the first transparent substrate have tapered sidewalls, with a diameter narrowing from a top surface of the first transparent substrate to a bottom surface of the first transparent substrate overlying the backplane top surface.

18. The panel of claim 17 further comprising:
a reflective material lining the THVs in the substrate.

19. A method for forming a direct-emission display panel comprising:
providing a display backplane with a top surface;
forming a plurality of light emitting diode (LED) disks overlying the backplane top surface arranged in pixel sections each comprising a plurality of LED disks, where each LED disk is capable of emitting a common first color;
forming a first transparent substrate;
forming through-hole vias (THVs) in the first transparent substrate, to overlie a first LED disk in each pixel section;
forming a color phosphor material in the THVs in the first transparent substrate, capable of passing a second color, different than the first color;
forming a first color filter, capable of blocking the first color, overlying the THVs in the first transparent substrate; and,
stacking the first transparent substrate overlying the display backplane top surface.

20. The method panel of claim 19 wherein forming the LED disks overlying the backplane includes arranging each pixel section to comprise (n) LED disks;
the panel further comprising:
forming (n−2) transparent substrates;
forming THVs in the (n−2) transparent substrates to respectively overlie a unique LED disk in each pixel section;
forming (n−2) unique color phosphor materials, respectively, in the THVs of the (n−2) transparent substrates, capable of passing (n−2) unique colors different than the first color and the second color;
forming a first color filter overlying the THVs in the (n−2) transparent substrates; and,
stacking the (n−2) transparent substrates overlying the first transparent substrate.

21. The method of claim 19 wherein forming the THVs in the first transparent substrate includes forming tapered sidewalls in the THVs, with diameters narrowing from a top surface of the substrate to a bottom surface of the substrate overlying the backplane.

22. The method of claim 21 further comprising:
lining the THVs in the substrate with a reflective material.

* * * * *